United States Patent [19]

Shimmyo

[11] Patent Number: 5,008,487
[45] Date of Patent: Apr. 16, 1991

[54] CASING STRUCTURE

[75] Inventor: Takashi Shimmyo, Musashino, Japan

[73] Assignee: Kabushiki Kaisha Toshiba, Kawasaki, Japan

[21] Appl. No.: 388,856

[22] Filed: Aug. 3, 1989

[30] Foreign Application Priority Data

Aug. 9, 1988 [JP] Japan .................................. 63-105186

[51] Int. Cl.$^5$ .............................................. H05K 9/00
[52] U.S. Cl. ............................................... 174/35 R
[58] Field of Search .......... 174/35 R, 35 MS, 35 GC, 174/51, 52.1; 361/424, 390; 219/10.55 D, 10.55 R

[56] References Cited

U.S. PATENT DOCUMENTS 2,065,651 12/1936 Burton ........................... 174/35 GC
3,902,002 8/1975 Smith ..................................... 174/51
4,370,516 1/1983 Bailey, Jr. et al. ................... 174/52.1

Primary Examiner—Leo P. Picard
Assistant Examiner—Bot L. Ledynh
Attorney, Agent, or Firm—Foley & Lardner

[57] ABSTRACT

A casing structure adapted for accommodating an electronic equipment or instrument generally comprises a body and a lid which are to be mated together. The inner surfaces of the walls of the body and the lid are coated with conductive coating materials and the conductive coats of the body and the lid are maintained to be at equal potential through a conductive member. The side wall of the body is provided with an inward-projecting edge for defining the opening of the body and an outward recess and the side wall of the lid is provided with an inward recessed edge for defining the opening of the lid and an outward-projecting portion, the recessed edge of the lid being mated with the projected edge of the body when they are connected. The conductive member of generally U-shaped section has one end portion disposed between the outer surface of the side wall of the projected edge of the body and the conductive coat applied on an inner surface of the projected portion of the lid and the other end portion pressed to the coat on the inner surface of the side wall of the body.

6 Claims, 2 Drawing Sheets

CASING STRUCTURE

BACKGROUND OF THE INVENTION

This invention relates to a casing structure formed of a plastic material and, more particularly, a structure of a casing having an improved shielding performance with respect to electromagnetic waves for accommodating electronic elements or equipment.

Recently, in accordance with the requirement for electronic equipment or instruments to be made compact, computerized or operated with high frequencies, a plastic material has been widely utilized for a material constituting a structure of a casing for accommodating the electronic equipment or instruments in view of design for the appearance and the reduction of the overall weight thereof.

However, in a case where the casing made of a plastic material is utilized for accommodating the electronic equipment, electromagnetic waves are generated from the accommodated equipment externally through the wall structure of the casing made of the plastic material and the thus generated electromagnetic waves adversely affect radio units, television sets or other electronic equipment or instruments disposed externally to the casing. Namely, in adverse cases, the radio unit may generate noises and disturbance may be caused to picture images of the television set due to the electromagnetic waves emitted from the equipment disposed in the casing. This equipment may eventually operate erroneously. Furthermore these adverse phenomena may adversely affect persons and, accordingly, some restrictions or regulations against the thus emitted electromagnetic waves have been made. Conversely, the electronic equipment accommodated in the plastic casing may be damaged by the electromagnetic waves from the external environment and in particular, the electromagnetic waves from the equipment or instruments using microcomputers will be significantly influenced.

In order to effectively eliminate the influence of the electromagnetic waves, a method has been provided in which a conductive coating is made on the inner wall surface of the plastic casing. In this method, in order to achieve an adequate electromagnetic wave shielding effect, it is necessary to keep the entire coated portion at a uniform electric potential and, desirably, to ground the electric conductive portions.

The casing is usually composed of two parts, i.e. a lid portion and a body portion, which are separable into two independent parts. Because of the separated structure, it is necessary to establish electrical conductivity between the conductive coat on the inner surface of the lid portion of the casing and the conductive coat on the inner surface of the body portion of the casing.

In order to achieve electrical conductivity therebetween, one conventional example provides a technique in which bosses are formed on the lid and body portions respectively and the bosses are electrically connected by means of vises, for example, to establish the electrically conductive conditions therebetween through the wire means. Another conventional example provides a structure of the casing in which a lid portion and a body portion are provided with lug portions which are to be connected when the lid and the body are mated and the surfaces of the lug portions are coated with a conductive material. A further conventional example provides a structure of the casing in which a lid portion is provided with a recess having a surface on which a conductive material is coated, and a body portion is provided with a protrusion having a surface on which a conductive material is coated. The protrusion and the recess are mated together to be electrically conductive when the lid is applied to the body.

With the first example described, however, it takes much time to assemble the casing and, hence, the workability thereof is not effective. With the second example, since the lug portions are formed on the outer surfaces of the lid and the body, it is necessary to take care with the arrangement of the casing. With the third example, it is necessary to coat the conductive material on the outer surface, as well as the inner surface, of the protrusion of the body of the casing and such coating working is troublesome. Moreover, the electrically conductive condition may not be established in cases where the protrusion of the body is not intimately contacted to the recess of the lid.

SUMMARY OF THE INVENTION

An object of this invention is to substantially eliminate the defects and drawbacks encountered in the conventional technique described above and to provide a casing having a structure capable of being easily assembled with an effective workability.

Another object of this invention is to provide a casing having a lid structure and a body structure that both easily and surely provide a conductive state with equal potential between the lid and the body when mated together.

These and other objects can be achieved according to this invention by providing a structure of a casing particularly for accommodating an electronic equipment or instrument, the casing structure comprising, a body provided with a side wall having an inner surface on which a conductive coat is applied and an opening defined by the side wall, the side wall being provided with an inward-projecting edge for defining the opening and an outward recess, a lid provided with a side wall having an inner surface on which a conductive coat is applied and an opening defined by the side wall, the side wall being provided with an inward-recessed edge for defining the opening of the lid and an outward-projecting portion, the recessed edge of the lid being mated with the projecting edge of the body when they are connected, and a conductive member having one end portion disposed between an outer surface of the side wall of the projected edge of the body and a conductive coat applied on an inner surface of the projected portion of the lid and the other end portion pressed to said coat on the inner surface of the side wall of the body.

With a preferred embodiment of this invention, the projected portion of the lid is provided with a projection extending downwardly and having a hole formed at substantially the central portion thereof, the outward recess of the body is provided with a cutout and a hole is formed in the side wall of the body in the recess, and both the end portions of the conductive member are provided with holes, the holes of the projection, the body wall and the conductive member being aligned when the body, the lid and the conductive member are assembled.

With a further preferred embodiment, the casing is of a box shaped rectangular in section and a plurality of conductive members are disposed to opposing side walls of the body and the lid.

According to the casing structure of the character described above, the body and the lid having inner surfaces on which the conductive coat are applied, are made conductive through a conductive member with equal potential and, accordingly, the shielding performance of the casing against the electromagnetic waves from the inside and the outside of the casing can be effectively attained. The structure of the casing for attaining such shielding performance can be simplified and assembled easily.

Preferred embodiments of the casing structure particularly for accommodating electronic equipment or instruments will be described in further detail hereunder with reference to the accompanying drawings.

DESCRIPTION OF THE PREFERRED EMBODIMENTS

Figure 4:
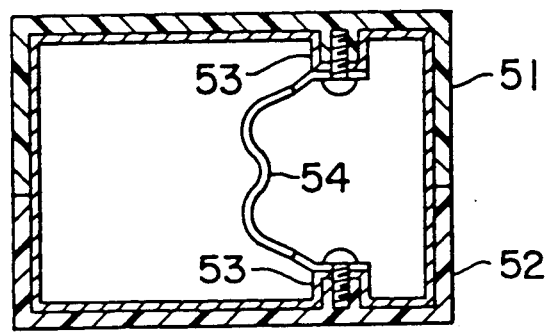
FIGS. 4 to 6 are sectional views representing conventional casing structures and showing the connected portions of the bodies and the lids, respectively.
Figure 5:
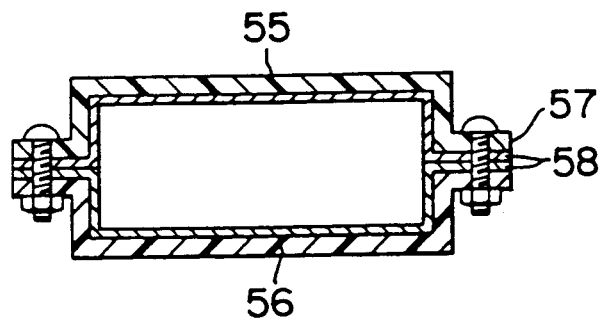
Figure 6:
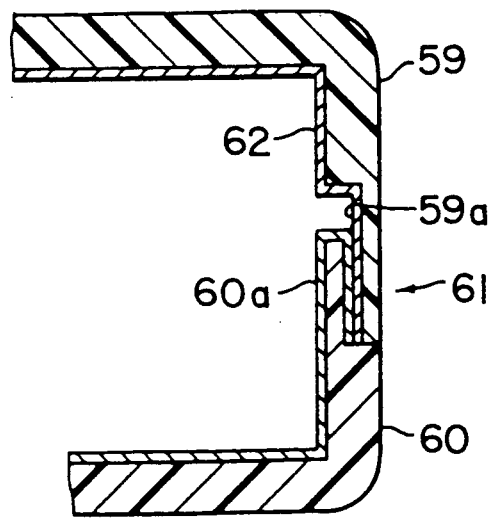

For a better understanding of this invention, conventional examples of casing structures each having a lid and a body which are made electrically conductive when they are assembled will be first described hereunder with reference to FIGS. 4 to 6 and prior to the description of preferred embodiments according to this invention.

FIG. 4 shows a sectional view of a casing composed of a lid portion 51 and a body portion 52 which are assembled into one casing by forming bosses 53 to the inner surfaces thereof and vises are screwed in the bosses 53. The bosses are electrically connected by means of a wire 54 connecting the respective vises to establish the conductive condition therebetween. The inner surfaces of the lid 51 and the body 52 are coated with a conductive material. FIG. 5 shows another conventional example of a casing having a structure in which a lid portion 55 and a body portion 56 are provided at the outer sides thereof with lug portions 57 which are to be connected when the lid 55 and the body 56 are mated together. The surfaces of the lug portions 57 are coated with a conductive material 58. FIG. 6 shows a further example of a structure of the conventional casing in which a lid portion 59 is provided with a recess 59a having a surface on which a conductive material is coated and a body portion 60 is provided with a projection 60a having a surface on which a conductive material is coated. The projection 60a and the recess 59a are mated together to be conductive when the lid 59 is applied to the body 60.

These conventional casings provide the defects and drawbacks described hereinbefore in view of the smooth and effective assembling the lid and the body and the secure establishment of the conductive state therebetween when they are assembled.

This invention conceived to solve the problems of the conventional technology will be described hereunder with reference to preferred embodiments shown in FIGS. 1 to 3.

Figure 1:
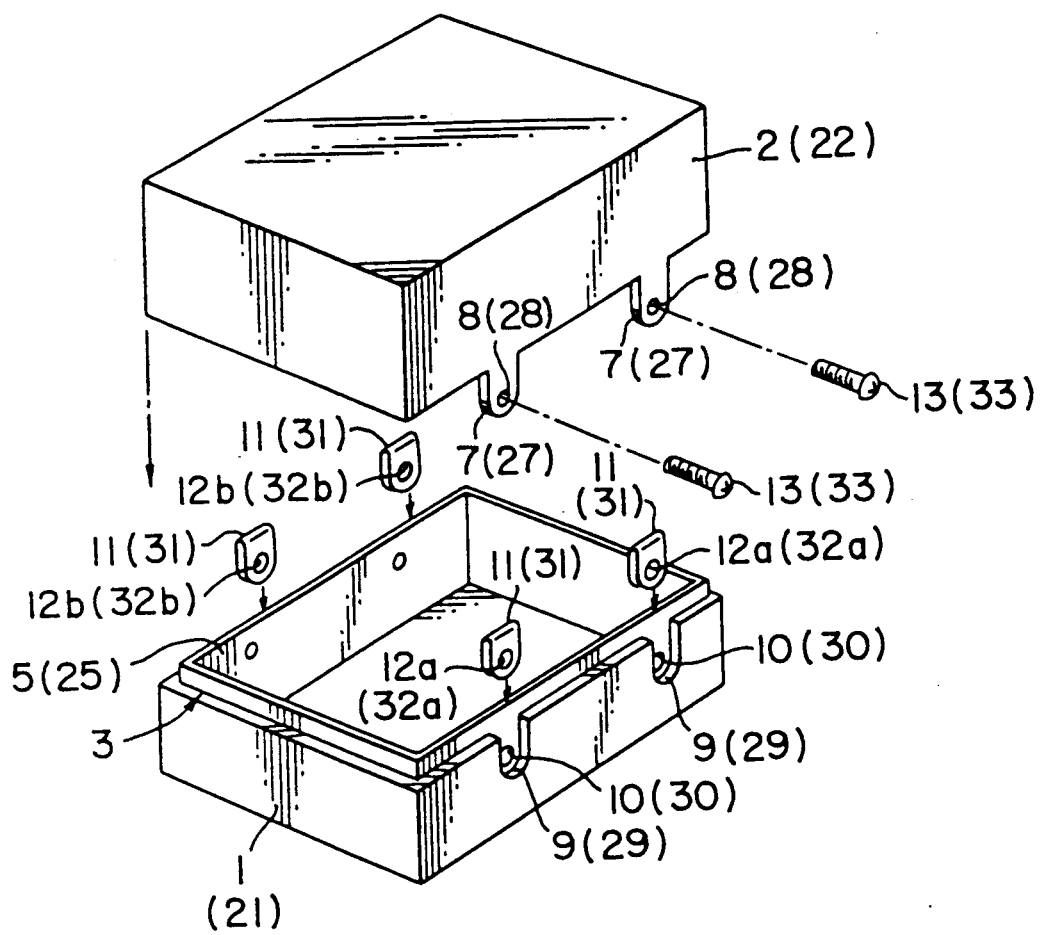
FIG. 1 is a perspective view showing one embodiment of a casing structure comprising a body and a lid according to this invention.

FIG. 1 is a perspective view of a casing of box shape rectangular in section according to this invention showing the whole structure thereof and, referring to FIG. 1, a casing is composed of a casing body 1 provided with an upper opening defined by four side walls and a bottom wall and a lid 2 provided with an opening defined by four side walls and a top wall. These openings are mated together when they are connected. The upper portions of the side walls of the body are formed with projected edges 3 with outward recesses and the lower portions (as viewed) of the side walls of the lid 2 are formed with inward-recessed edges 4 with the outward-projecting portions. These projected edges 3 of the body and the recessed edges 4 of the lid 2 have outer configurations that engage with each other when the lid 2 is applied to the body 1. The body 1 and the lid 2 are provided with inner walls on which conductive coats 5 and 6 are respectively applied. A pair of projections 7 are formed integrally with the outward-projecting portions of each of a pair of opposed side walls of the lid 2 so as to downwardly extend in the illustration of FIG. 1. The projections 7 are provided with holes 8 at substantially the central portions of the projected ends thereof. A pair of cutouts 9 are formed in the outward recessed portions of each of a pair of opposed side walls of the body 1 at locations corresponding to those of the projections 7. Holes 10 are also formed to the outer wall of the body 1 inside the cutouts 9 in axial alignment with the holes 8 of the projections 7.

Figure 2:
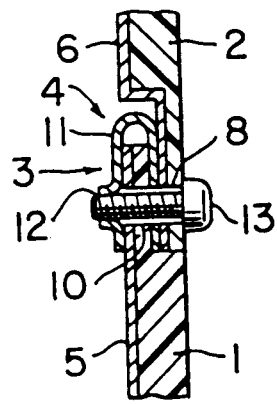
FIG. 2 is an enlarged sectional view showing a part of the casing at which the body and the lid are connected.

As is best illustrated in FIG. 2, a conductive member 11 is made of a thin conductive metallic plate bent to have a U-shaped cross section and is disposed so that one end portion of the bent conductive member 11 is disposed between the conductive coat 6 applied to the inner surface of each projection 7 of the lid 2 and the outer wall of the cutout portion of the body 1 and the other end portion of the conductive member 11 is pressed to the conductive coat 5 applied to the inner wall surface of the body 1. The conductive members 11, as shown in FIG. 1, are provided with inner holes 12a and outer holes 12b to which taps are formed at portions in axial alignment with the holes 8 and 10 when the lid 2 is applied to the body 1. The conductive members 11 are respectively secured to the body and lid by screwing vises 13 into holes 8, 10 and 12. The vises are engaged with the tapped holes 12b of the conductive members 11.

According to the construction of the embodiment of the casing of this invention, when it is required to assemble the conductive member 11, one end portion thereof is pressed against the conductive coat 6 on the inner wall of the lid 2 at the opening portion thereof and the other end thereof is then pressed against the outer wall of the body 1. The lid 2 and the body 1 are then mated together so that the projections 7 of the lid 2 are engaged with the cutouts 9 of the body 1 in axial alignment with the holes 8 and 10 with the conductive members 11 interposed therebetween, while maintaining the conductive state between the conductive coat 6 on the lid 2 and the conductive coat 5 on the body 1. The vises 13 are thereafter screwed in the holes thereby to secure the lid 2 to the body 1, as shown in FIG. 2.

According to the embodiment described hereinabove, the conductive state between the conductive coats 5 and 6 can be maintained with an equal potential by way of the conductive members 11, whereby the electromagnetic waves generated from the elements disposed inside the casing can be substantially shielded as well as the transfer of the electromagnetic waves from the external environment into the casing.

Figure 3:
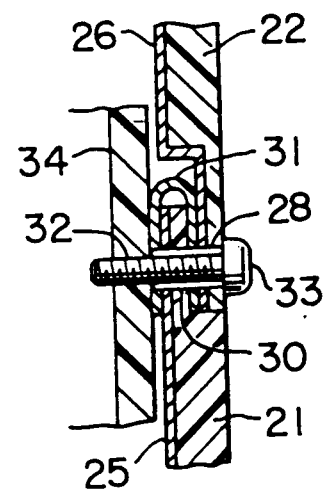
FIG. 3 shows a view, similar to that shown in FIG. 2, representing another embodiment according to this invention.

FIG. 3 represents another embodiment according to this invention. Referring to FIG. 3, reference numeral 21 designates a casing body having an inner wall on which a conductive coat 25 is applied and the casing body 21 is provided with an opening defined by four side walls and a bottom wall. The upper portions of the side walls are formed to have inward projected edges with outward stepped recess. Reference numeral 22 designates a casing lid having an inner wall on which a conductive coat 26 is applied. The lid 22 is provided with an opening defined by four side walls and a top wall and the lower portions of the side walls are formed to have inward recessed edges with outward projected portions. The inward recessed edges have configurations corresponding to the configurations of the inward projected edges of the body 21. Projections 27 are formed integrally with the outward projected portions of the lid 22 with the central holes 28 and cutouts 29 are formed to the outward recesses of the body 21 with the central holes 30. The locations of these projections 27 and the cutouts 29 are made in substantially the same manner as those of the embodiment shown in FIG. 2.

A conductive member 31 made of a thin metallic plate is disposed so as to be press contacted to the conductive coats 25 and 26 by substantially the same manner as the conductive member 11 of the first embodiment shown in FIG. 2. The conductive member 31 is also provided with inner and outer holes 32a and 32b with no tap. In assembling the body 21 and the lid 22, vises 33 are inserted into these holes 28, 29 and 32. According to this embodiment, an equipment accommodated in the casing is provided with a portion to which tapped holes 34 are formed and the vises 33 are screwed with these holes 34, whereby the equipment can be screwed and secured to the casing together. Furthermore, according to this embodiment, in a case where the equipment is itself grounded, the conductive coats 25 and 26 are grounded together, whereby the shielding performance against electromagnetic waves can be further improved.

It is to be understood by persons skilled in the art, that this invention is not limited to the described embodiments and that many other changes or modifications may be made without departing the scope and spirit of the appended claim.

I claim:

1. A structure of a casing particularly for accommodating an electronic instrument or equipment comprising:
   a body provided with a side wall having an inner surface on which a conductive coat is applied and an opening defined by the side wall, said side wall being provided with an inward-projected edge for defining the opening and an outward recess;
   a lid provided with a side wall having an inner surface on which a conductive coat is applied and an opening defined by the side wall, said side wall being provided with an inward-recessed edge for defining the opening of the lid and an outward projected portion, said recessed edge of the lid being mated with said projected edge of the body when they are connected;
   a conductive means having one end portion disposed between an outer surface of said side wall of the projected edge of the body and a conductive coat applied on an inner surface of the projected portion of the lid and the other end portion pressed to said coat on the inner surface of the side wall of the body; and
   wherein said projected portion of said lid is provided with a projection extending downwardly and having a hole formed at substantially the central portion thereof, said recess of said body being provided with a cutout and a hole is formed in the side wall of the body in said recess, and both the end portions of said conductive means are provided with holes, said holes of the projection, the body wall and the conductive means being aligned when said body, said lid and said conductive means are assembled.

2. A casing structure according to claim 1, wherein one of said holes formed in the other end portion of the conductive means is provided with a tap to be engaged with a screw means when said screw means is inserted into said holes of said body, said lid and said conductive means in an aligned condition.

3. A casing structure according to claim 1 wherein said conductive means is a conductive metallic plate bent substantially in a U-shape.

4. A structure of a casing particularly for accommodating an electronic instrument or equipment comprising:
   a body provided with a side wall having an inner surface on which a conductive coat is applied and an opening defined by the side wall, said side wall being provided with an inward-projected edge for defining the opening and an outward recess;
   a lid provided with a side wall having an inner surface on which a conductive coat is applied and an opening defined by the side wall, said side wall being provided with an inward-recessed edge for defining the opening of the lid and an outward projected portion, said recessed edge of the lid being mated with said projected edge of the body when they are connected;
   a conductive means having one end portion disposed between an outer surface of said side wall of the projected edge of the body and a conductive coat applied on an inner surface of the projected portion of the lid and the other end portion pressed to said coat on the inner surface of the side wall of the body;
   said body is of a box shape rectangular in section and having four side walls and said lid is of a box shape rectangular in section and having four side walls and wherein said conductive means comprises a plurality of conductive members disposed to opposing side walls of said body and said lid; and
   wherein said projected portion of said lid is projected portion of said lid is provided with at least one projection extending downwardly and having a hole formed at substantially the central portion thereof, said outward recess of said body is provided with at least one cutout and a hole is formed in the side wall of he body in said recess, and both the end portions of each of said conductive members are provided with holes, said holes of the projection, the body wall and the conductive member being aligned when said body, said lid and said conductive member are assembled.

5. A casing structure according to claim 4, wherein each of said conductive members is a conductive metallic plate bent substantially in a U-shape.

6. A casing structure according to claim 4, wherein one of the holes formed in the other end portion of each of said conductive members is provided with a top to be engaged with a screw means when said screw means is inserted into said holes of said body, said lid and said conductive members in an aligned condition.

* * * * *